(12) United States Patent
Shabra et al.

(10) Patent No.: US 10,833,697 B2
(45) Date of Patent: Nov. 10, 2020

(54) METHODS AND CIRCUITS FOR SUPPRESSING QUANTIZATION NOISE IN DIGITAL-TO-ANALOG CONVERTERS

(71) Applicant: MEDIATEK Singapore Pte. Ltd., Singapore (SG)

(72) Inventors: Ayman Shabra, San Jose, CA (US); Stacy Ho, San Jose, CA (US); Michael A. Ashburn, Jr., San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/558,796

(22) Filed: Sep. 3, 2019

(65) Prior Publication Data
US 2020/0083900 A1    Mar. 12, 2020

Related U.S. Application Data

(60) Provisional application No. 62/728,126, filed on Sep. 7, 2018, provisional application No. 62/727,576, filed on Sep. 6, 2018.

(51) Int. Cl.
*H03M 1/66* (2006.01)
*H03M 3/00* (2006.01)
(Continued)

(52) U.S. Cl.
CPC ............ *H03M 3/418* (2013.01); *H03M 3/42* (2013.01); *H03M 3/436* (2013.01); *H03M 1/00* (2013.01);
(Continued)

(58) Field of Classification Search
CPC ............ H03M 1/66; H03M 1/00; H03M 3/30; H03M 1/1009
(Continued)

(56) References Cited

U.S. PATENT DOCUMENTS 9,577,657 B1 * 2/2017 Clara ...................... H03M 3/38
2014/0301571 A1   10/2014 Melanson et al.
(Continued)

OTHER PUBLICATIONS

Galton, Spectral shaping of circuit errors in digital-to-analog converters. IEEE Transactions on Circuits and Systems II: Analog and digital signal processing. Oct. 1997;44(10):808-17.
(Continued)

*Primary Examiner* — Joseph J Lauture
(74) *Attorney, Agent, or Firm* — Wolf, Greenfield & Sacks, P.C.

(57) ABSTRACT

Circuits and methods for converting digital input signals into the analog domain are described. Such circuits may perform the conversion in a segmented fashion. For example, a circuit may include a most significant bit (MSB) path and a least significant bit (LSB) path. The MSB path may include a first delta-sigma modulator having first and second outputs and a first digital-to-analog converter coupled to the first output of the first delta-sigma modulator. The LSB path comprises a second delta-sigma modulator comprising a loop filter and a quantizer. The quantizer may have an input coupled to the loop filter and to the digital filter. The LSB path may further include a second digital-to-analog converter coupled to an output of the quantizer. The circuit may further include a digital filter and/or a gain stage interposed between the MSB path and the LSB path.

20 Claims, 17 Drawing Sheets

(51) Int. Cl.
    *H03M 1/10* (2006.01)
    *H03M 1/00* (2006.01)
(52) U.S. Cl.
    CPC ............ *H03M 1/1009* (2013.01); *H03M 1/66* (2013.01); *H03M 3/30* (2013.01)
(58) Field of Classification Search
    USPC ......................... 341/144, 145, 143, 146, 120
    See application file for complete search history.

(56) References Cited

U.S. PATENT DOCUMENTS

2015/0171886 A1    6/2015    Kinyua
2015/0295584 A1    10/2015   Das et al.

OTHER PUBLICATIONS

O'Brien et al., A reduced hardware ISI and mismatch shaping DEM Decoder. Circuits, Systems, and Signal Processing. Oct. 2017 3:19 pages.
Risbo et al., Digital approaches to ISI-mitigation in high-resolution oversampled multi-level D/A converters. IEEE Journal of Solid-State Circuits. Dec. 2011;46(12):2892-903.
Sanyal et al., Dynamic Element Matching Techniques for Static and Dynamic Errors in Continuous-Time Multi-Bit ΔΣ Modulators. IEEE Journal on Emerging and Selected Topics in Circuits and Systems. Dec. 4, 2015;5(4):598-611.
Schreier et al., Noise-shaped multibit D/A convertor employing unit elements. Electronics Letters. Sep. 28, 1995;31(20):1712-3.
Sun et al., Low-Complexity High-Order Vector-Based Mismatch Shaping in Multibit ΔΣ ADCs. IEEE Transactions on Circuits and Systems II: Express Briefs. Dec. 2011;58(12):872-6.
Sun, High-order mismatch-shaping in multibit DACs. IEEE Transactions on Circuits and Systems II: Express Briefs. Jun. 27, 2011;58(6):346-50.
Yasuda et al., A third-order Δ-Σ modulator using second-order noise-shaping dynamic element matching. IEEE journal of solid-state circuits. Dec. 1998;33(12):1879-86.
Partial European Search Report for European Application No. EP 19195896.6 dated Feb. 11, 2020.
Gerasta et al., 2-1, 2-2 and 2-1-1 MASH Delta-sigma modulator for 18-bit audio digital to analog converter. International Journal of Electronics and Electrical Engineering. Feb. 2015;3:44-9.
Shabra et al., A 20 kHz Bandwidth Resistive DAC with 135 dBA Dynamic Range and 125 dB THD. 2019 IEEE Custom Integrated Circuits Conference (CICC) Apr. 14, 2019:1-4.
Wescott, Sigma-delta techniques extend DAC resolution. Embedded Systems Programming. Jun. 23, 2004:9 pages. https://www.embedded.com/sigma-delta-techniques-extend-dac-resolution/ [last accessed Apr. 2, 2020].

\* cited by examiner

METHODS AND CIRCUITS FOR SUPPRESSING QUANTIZATION NOISE IN DIGITAL-TO-ANALOG CONVERTERS

CROSS REFERENCE TO RELATED APPLICATIONS

This Application claims priority under 35 U.S.C. § 119(e) to U.S. Provisional Application Ser. No. 62/727,576, entitled "NOISE COUPLED SEGMENTATION METHOD" filed on Sep. 6, 2018, which is herein incorporated by reference in its entirety.

This Application claims priority under 35 U.S.C. § 119(e) to U.S. Provisional Application Ser. No. 62/728,126, entitled "ELEMENT SELECTION LOGIC WITH MISMATCH SHAPING AND ISI REDUCTION" filed on Sep. 7, 2018, which is herein incorporated by reference in its entirety.

BACKGROUND

Digital-to-analog converters (DACs) are systems that convert digital signal into analog signals. DACs are commonly used in music players to convert digital data streams into analog audio signals. DACs are also used in televisions and mobile phones to convert digital video data into analog video signals which connect to the screen drivers to display monochrome or color images.

BRIEF SUMMARY

Some embodiments relate to a circuit comprising a most significant bit (MSB) path comprising: a first delta-sigma modulator having first and second outputs; and a first digital-to-analog converter coupled to the first output of the first delta-sigma modulator; a digital filter coupled to the second output of the first delta-sigma modulator; and a least significant bit (LSB) path comprising: a second delta-sigma modulator comprising a loop filter and a quantizer, the quantizer having an input coupled to the loop filter and to the digital filter; and a second digital-to-analog converter coupled to an output of the quantizer.

The first delta-sigma modulator may comprise a first quantizer, wherein the first output of the first delta-sigma modulator may be an output of the first quantizer, and the quantizer may be a second quantizer.

The second output of the first delta-sigma modulator may be derived from the output of the first quantizer.

The first delta-sigma modulator further comprises a first loop filter, a first adder and a second adder, wherein the first adder may be coupled to an input of the first quantizer, the second adder may be coupled to the output of the first quantizer and the first loop filter may be coupled between the first adder and the second adder, and wherein the loop filter may be a second loop filter.

The second output of the first delta-sigma modulator may be an output of the second adder.

The second digital-to-analog converter may have less inputs than the first digital-to-analog converter.

The circuit may further comprise an amplifier coupled to the digital filter.

The amplifier may be coupled to an output of the digital filter.

The second delta-sigma modulator may further comprise a first adder and a second adder, wherein the first adder may be coupled to the input of the quantizer, the second adder may be coupled to the output of the quantizer and the loop filter may be coupled between the first adder and the second adder.

The first adder may be coupled between the digital filter and the input of the quantizer.

Some embodiments relate to a circuit comprising a most significant bit (MSB) path comprising: a first delta-sigma modulator having first and second outputs; and a first digital-to-analog converter coupled to the first output of the first delta-sigma modulator; an amplifier coupled to the second output of the first delta-sigma modulator; and a least significant bit (LSB) path comprising: a second delta-sigma modulator comprising a loop filter and a quantizer, the quantizer having an input coupled to the loop filter and to the amplifier; and a second digital-to-analog converter coupled to an output of the quantizer.

The first delta-sigma modulator may comprise a first quantizer, wherein the first output of the first delta-sigma modulator may be an output of the first quantizer, and wherein the quantizer may be a second quantizer.

The first delta-sigma modulator may further comprise a first loop filter, a first adder and a second adder, wherein the first adder may be coupled to an input of the first quantizer, the second adder may be coupled to the output of the first quantizer and the first loop filter may be coupled between the first adder and the second adder, and wherein the loop filter may be a second loop filter.

The second output of the first delta-sigma modulator may be an output of the second adder.

The second digital-to-analog converter may have less inputs than the first digital-to-analog converter.

The second delta-sigma modulator may further comprise a first adder and a second adder, wherein the first adder may be coupled to the input of the quantizer, the second adder may be coupled to the output of the quantizer and the loop filter may be coupled between the first adder and the second adder.

The first adder may be coupled between the amplifier and the input of the quantizer.

Some embodiments relate to a method comprising: processing an input signal with a first delta-sigma modulator; converting an output of the sigma-delta modulator with a first digital-to-analog converter; filtering, with a digital filter, a quantization noise extracted from the first delta-sigma modulator; quantizing the filtered quantization noise with a quantizer of a second delta-sigma modulator; converting the quantized filtered quantization noise with a second digital-to-analog converter; and generating an output signal using an output of the first digital-to-analog converter and an output of the second digital-to-analog converter.

The method may further comprise amplifying the filtered quantization noise.

Generating an output signal may comprise adding the output of the first digital-to-analog converter with the output of the second digital-to-analog converter.

Some embodiments relate to a method for controlling a digital-to-analog converter (DAC) having a plurality of switches, the method comprising: processing an input digital signal with a delta-sigma modulator; and generating, based on the processed input digital signal, a control signal comprising N control bits, each one of the N control bits being configured to control a respective switch of the plurality of switches of the DAC, wherein: the generating comprises toggling, in each of a plurality of clock cycles, a same number of control bits of the N control bits from a first value to a second value, the number being less than N, and the toggling comprises setting a threshold value.

The method may further comprise generating a plurality of state signals based on the processed input digital signal and generating the N control bits based on the plurality of state signals, wherein toggling the same number of control bits may comprise toggling a subset of the N control bits corresponding to respective state signals that exceed the threshold value or are below the threshold value.

Setting the threshold value may comprise performing a search algorithm.

Performing the search algorithm may comprise varying the threshold value until a predefined number of the plurality of state signals exceeds or is below the threshold value.

The plurality of state signals may exhibit triangular waves.

Generating, based on the processed input digital signal, the control signal may comprise providing the processed input digital signal to a quantizer and to an adder.

Processing the input digital signal with the delta-sigma modulator may comprise processing the input digital signal with a second order delta-sigma modulator.

Some embodiments relate to a method for controlling a digital-to-analog converter (DAC) having a plurality of switches, the method comprising: processing an input digital signal using a delta-sigma modulator; and generating, based on the processed input digital signal, a plurality of bits and controlling the plurality of switches of the DAC based on respective bits of the plurality of bits, wherein the generating comprises: at a first clock cycle, setting a threshold to a first threshold value; selecting a first subset of M bits among the plurality of bits based on the first threshold value; and toggling each bit of the first subset from a first value to a second value; and at a second clock cycle; setting the threshold to a second threshold value; selecting a second subset of M bits among the plurality of bits based on the second threshold value; and toggling each bit of the second subset from the first value to the second value.

Setting the threshold to the first threshold value may comprises identifying a subset of M state variables among a plurality of state variables, each of the plurality of state variables corresponding to a respective bit of the plurality of bits, wherein the identified M state variables are the M largest state variables of the plurality of state variables or the M lowest state variables of the plurality of state variables; and setting the threshold to the first threshold value so that, during the first clock cycle, only the M state variables are above the first threshold value or only the M state variables are below the first threshold value.

Setting the threshold to the first threshold value may comprise performing a search algorithm until only the M state variables are above the first threshold value or only the M state variables are below the first threshold value.

The search algorithm may be a binary search algorithm.

Generating the plurality of bits may comprise generating a plurality of triangular waves based on the processed input digital signal.

Processing the input digital signal with the delta-sigma modulator may comprise processing the input digital signal with a second order delta-sigma modulator.

Toggling each bit of the first subset from the first value to the second value may comprise toggling each bit of the first subset from 0 to 1.

Some embodiments relate to a digital-to-analog conversion system comprising: a delta-sigma modulator; a resistive digital-to-analog converter (DAC) comprising a plurality of switches; and control circuitry, coupled to the delta-sigma modulator, for generating a plurality of bits and for controlling the plurality of switches of the DAC based on the plurality of bits, wherein the generating comprises: at a first clock cycle, setting a threshold to a first threshold value; selecting a first subset of M bits among the plurality of bits based on the first threshold value; and toggling each bit of the first subset from a first value to a second value; and at a second clock cycle; setting the threshold to a second threshold value; selecting a second subset of M bits among the plurality of bits based on the second threshold value; and toggling each bit of the second subset from the first value to the second value.

The generating may further comprise at the first clock cycle, toggling a subset of M switches from a first state to a second state.

The resistive DAC may comprise a plurality of resistors having substantially equal resistance.

Setting the threshold to the first threshold value may comprise identifying a subset of M state variables among a plurality of state variables, each of the plurality of state variables corresponding to a respective bit of the plurality of bits, wherein the identified M state variables are the M largest state variables of the plurality of state variables or the M lowest state variables of the plurality of state variables; and setting the threshold to the first threshold value so that, during the first clock cycle, only the M state variables are above the first threshold value or only the M state variables are below the first threshold value.

Setting the threshold to the first threshold value may comprise performing a search algorithm until only the M state variables are above the first threshold value or only the M state variables are below the first threshold value.

The delta-sigma modulator may be a second order delta-sigma modulator.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

I. Segmentation

Segmentation is a technique used in digital-to-analog conversion to reduce the complexity and area of a converter. Segmentation relies on the separation of the digital sequence to be converted in two tranches. The first tranche corresponds to the most significant bits and the second tranche corresponds to the least significant bits. One advantage of segmented digital-to-converters (DACs) is that they exhibit a significant reduction not only in in-band (within the bandwidth of the input signal) quantization noise, but also in out-of-band (outside the bandwidth of the input signal) quantization noise. Reducing out-of-band quantization noise is particularly beneficial in high dynamic range applications, in which out-of-band noise can move in-band due to the nonlinearity of the amplifier that follows the DAC.

The inventors have appreciated, however, that in certain applications, such as high-fidelity digital audio systems, segmented DACs may be too noisy. The inventors have further appreciated that the main source of noise in segmented DACs is the quantization associated with the quantization of the most significant bits.

The inventors have developed segmented DACs designed to suppress the quantization noise associated with the quantization of the most significant bits. The design of these DACs involves the use of one (or more than one) delta-sigma modulator for the most significant bits and one (or more than one) delta-sigma modulator for the least significant bits. In some embodiments, the noise suppression may be achieved by extracting the quantization noise associated with the most significant bits and by injecting the extracted noise directly into the quantizer of the delta-sigma modulator for the least significant bits. The extracted noise, prior to being injected into the quantizer, may be processed in such a way that the same quantization noise present at the output of the DAC associated with the most significant bits is also present at the output of the DAC associated with the least significant bits. In this way, the noise associated with the quantization of the most significant bits may be suppressed by subtracting the outputs of such DACs from one another. In some embodiments, processing of the extracted quantization noise may involve filtering of the extracted quantization noise. Additionally, or alternatively, processing of the extracted quantization noise may involve amplification of the extracted quantization noise.

Figure 1:
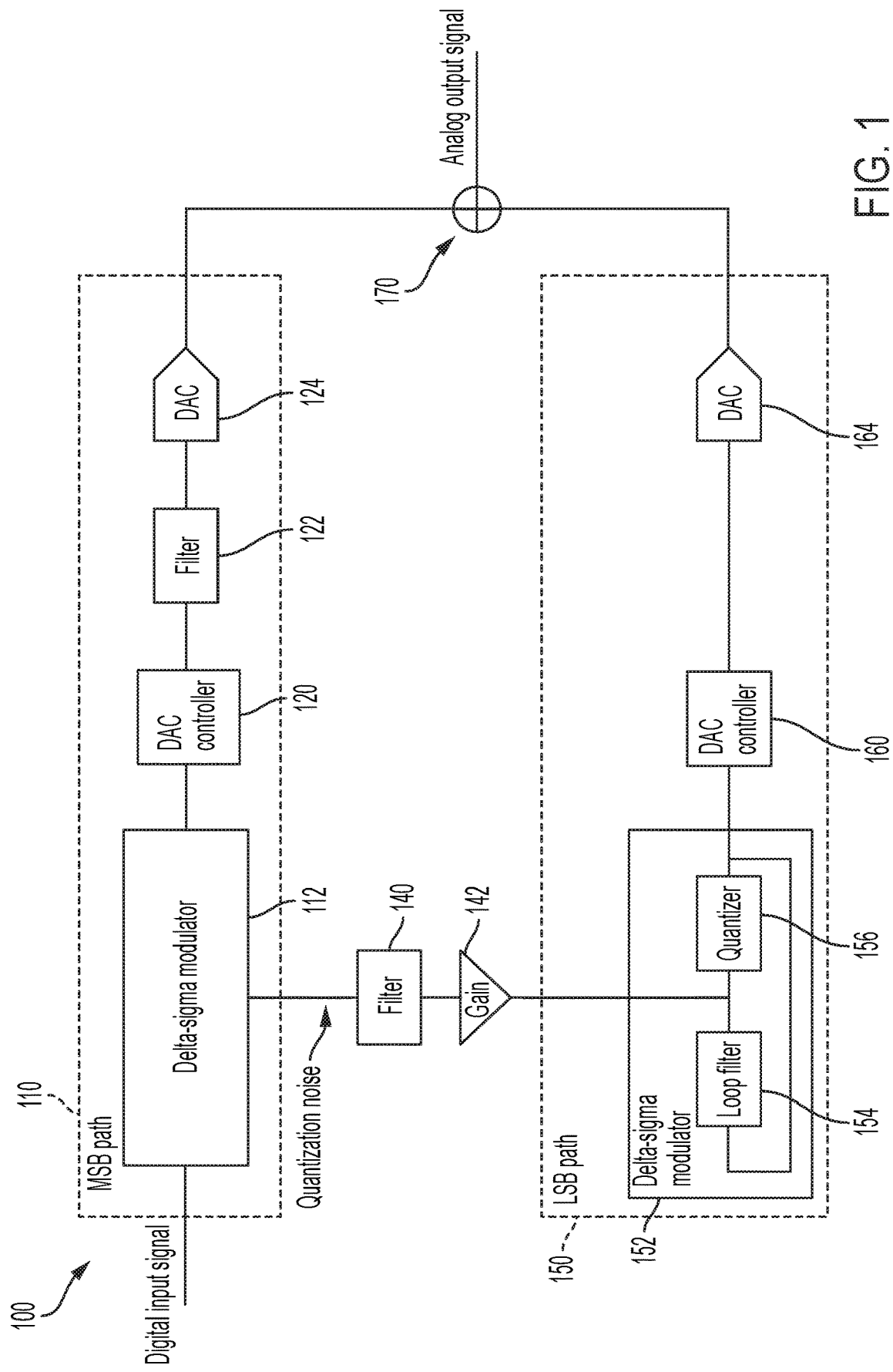
FIG. 1 is a block diagram illustrating a multi-segment digital-to-analog conversion circuit 100, in accordance with some embodiments.

FIG. 1 is a block diagram of a multi-segment digital-to-analog conversion circuit 100, in accordance with some embodiments. Circuit 100 includes a most significant bit (MSB) path 100 and a least significant bit (LSB) path 150. MSB path 110 is configured to convert into the analog domain the most significant bits of the digital input signal, and LSB path 150 is configured to convert into the analog domain the least significant bits of the digital input signal.

MSB path 110 includes a delta-sigma modulator 112, a digital-to-analog converter (DAC) controller 120, a filter 122 and DAC 124. LSB path 150 includes a delta-sigma modulator 152, a DAC controller 160 and a DAC 164. The DACs of the MSB and LSB path may be implemented in any suitable way, including for example using resistive unary-weight DACs or other types of resistive DACs.

DAC controllers 120 and 160 may include circuits (e.g., digital circuits) for controlling the operations of DACs 124 and 164, respectively. Filter 122 may be implemented using a finite impulse response (FIR) filter in some embodiments. Use of FIR filters may lead to a reduction in the number of bits that the DAC controller 124 handles, which in turn reduces the complexity of DAC controller 120.

Delta-sigma modulator 112 has two outputs. One output is coupled to DAC controller 120. Another output is coupled to the LSB path. As will be described in detail further below, the second output may be used to extract the quantization noise generated inside delta-sigma modulator 112, and to inject such a noise into the delta-sigma modulator of the LSB path.

Delta-sigma modulator 152 includes loop filter 154 and quantizer 156, which maps inputs from a set of high-precision values to outputs from a finite set of discrete values. An N-bit quantizer maps inputs to outputs from a set of $2^N$ values. Loop filter 154 has an input coupled to the output of quantizer 156 and an output coupled to the input of quantizer 156. Loop filter 154 may be designed to suppress or at least reduce out-of-band noise (noise outside the band of the signal to be converted) in the analog output signal. For example, loop filter 154 may include a digital integrator.

In some embodiments, a filter 140 may be interposed between the MSB path 110 and the LSB path 160. Filter 140 may be implemented using a digital FIR filter in some embodiments. Filter 140 may be used in lieu of FIR-DAC filters composed of DAC 164 and a filter disposed between DAC controller 160 and DAC 164. Relative to FIR-DAC implementations in which an filter is disposed between DAC controller 160 and DAC 164, using a digital filter interposed between the MSB path and the LSB path may simplify the design of the circuit because analog filters typically require greater numbers of DACs (and thus increases the total area of the chip). In one example implementing an analog filter, sixteen DACs are present at the output of DAC controller 160. However, the number of DACs may be reduced to a single unit by replacing the analog filter with a digital filter 140.

In some embodiments, a gain stage 142 may be interposed between the MSB path 110 and the LSB path 150. The gain stage 142 may be disposed between the MSB path 110 and filter 140, or between filter 140 and LSB path 150. In some embodiments, circuit 100 may include a filter 140 and a gain stage 142. In other embodiments, circuit 100 may include only one between filter 140 and gain stage 142.

Gain stage 142 may be implemented using an amplifier, such as a digital multiplier or a digital adder. As described in detail further below, providing a gain between the MSB path and the LSB path may lessen the impact of the quantization noise of quantizer 156 to the output signal.

Furthermore, interposing a gain stage between MSB path 110 and LSB path 150 may relax the gain needed at DAC 164 to provide the desired signal-to-noise ratio. This, in turn, leads to a substantial reduction in the area of the chip, given that gain in DACs is typically achieved using large resistors. Thus, gain stage 142 may remove the need for large resistors.

The analog output signal output by circuit 100 is obtained by adding, using adder 170, the output of DAC 124 with the output of DAC 164.

Figure 2:
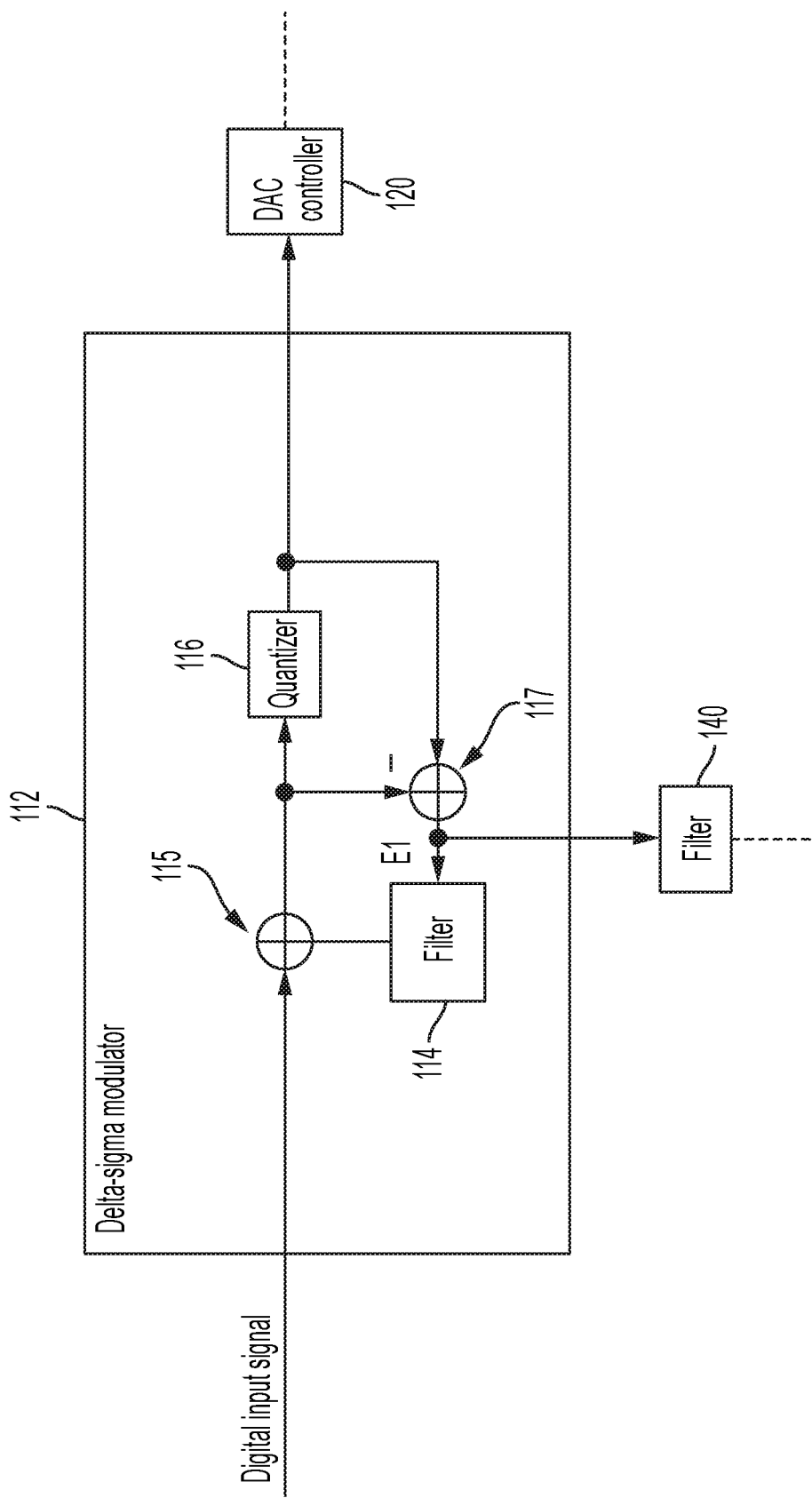
FIG. 2 is a block diagram illustrating an implementation of the delta-sigma modulator of the most significant bit path of the circuit of FIG. 1, in accordance with some embodiments.

FIG. 2 is a block diagram illustrating an implementation of the delta-sigma modulator of the most significant bit path of the circuit of FIG. 1, in accordance with some embodiments. In this implementation, delta-sigma modulator 112 includes adders 115 and 117, filter 114 and quantizer 116.

Quantizer 116 maps inputs from a set of high-precision values to outputs from a finite set of discrete values. Filter 114 may be designed to eliminate or at least reduce out-of-band noise. For example, filter 114 may include a FIR filter or an delay. Adder 115 adds the output of filter 114 to the digital input signal. The output of the adder 115 is provided as input to quantizer 116. Adder 117 subtracts the output of adder 115 from the output of quantizer 116. The output of adder 117 (labeled "E1") is provided as input to filter 114 and as input to the LSB path 150. In the implementation of FIGS. 1-2, for example, the output of adder 117 is coupled to the input of filter 140.

Being derived from the output of quantizer 116, signal E1 has a characteristic that is representative of the quantization noise of quantizer 116. For example, in some embodiments, the amplitude of signal E1 is proportional to the amplitude of the quantization noise of quantizer 116.

Figure 3:
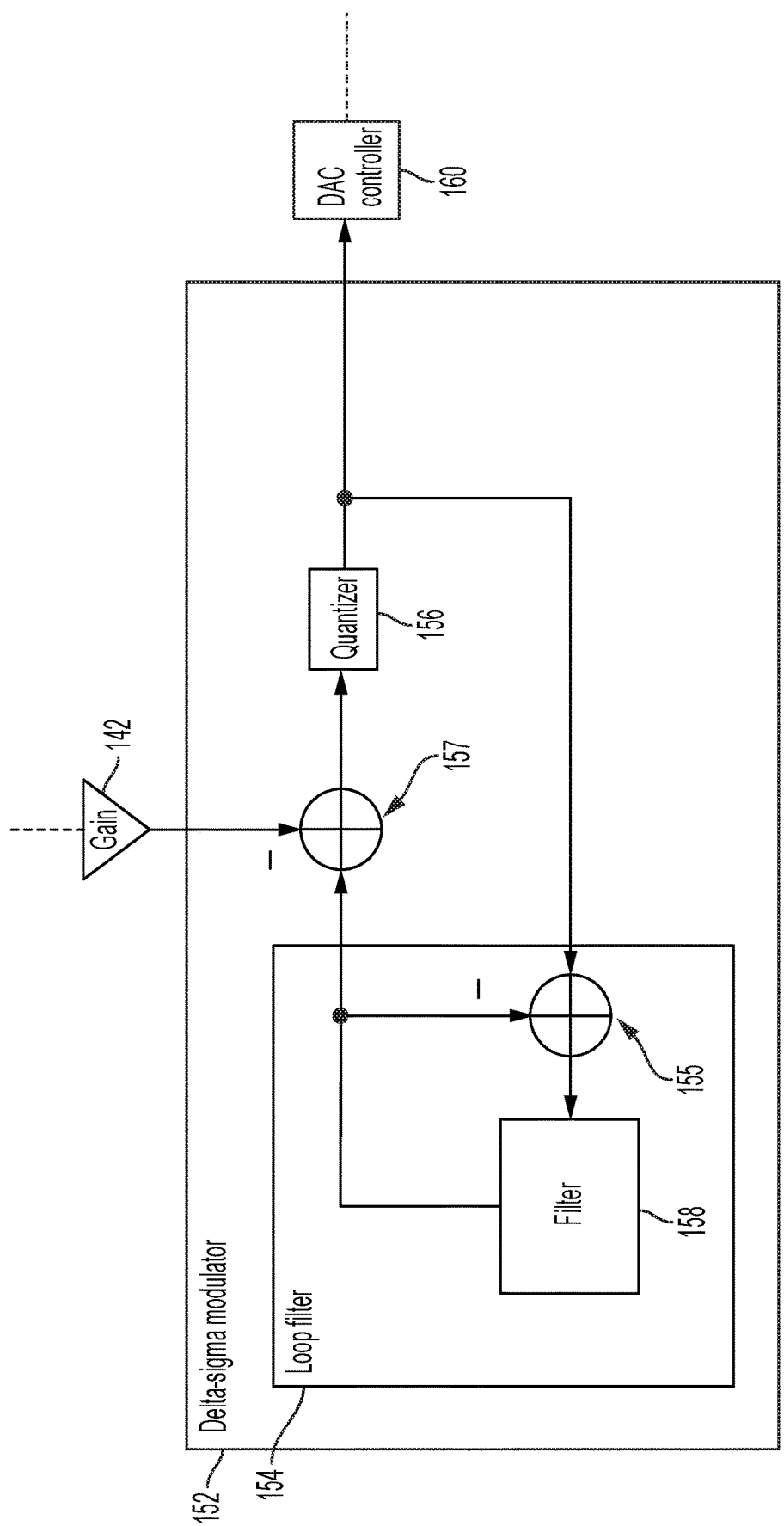
FIG. 3 is a block diagram illustrating an implementation of the delta-sigma modulator of the least significant bit path of the circuit of FIG. 1, in accordance with some embodiments.

FIG. 3 is a block diagram illustrating an implementation of the delta-sigma modulator of the least significant bit path of the circuit of FIG. 1, in accordance with some embodiments. In this implementation, delta-sigma modulator 152 includes adders 155 and 157, filter 158 and quantizer 156. Filter 158 and adder 155 may collectively serve as loop filter 154 of FIG. 1.

Adder 157 subtracts the output of MSB path 110 (which may pass through filter 140 and/or gain stage 142) from the output of filter 158. The output of the adder 157 is provided as input to quantizer 156. Adder 155 subtracts the output of filter 158 from the output of quantizer 156.

In some embodiments, the quantization noise of the MSB path may be injected into the quantizer of the LSB path so that the LSB path reflects not only the quantization noise of the LSB path itself, but also the quantization noise of the MSB path. In some embodiments, the quantization noise of the MSB path may be suppressed (or at least attenuated) by subtractively combine the output of the LSB path with the output of the MSB path.

Figure 4:
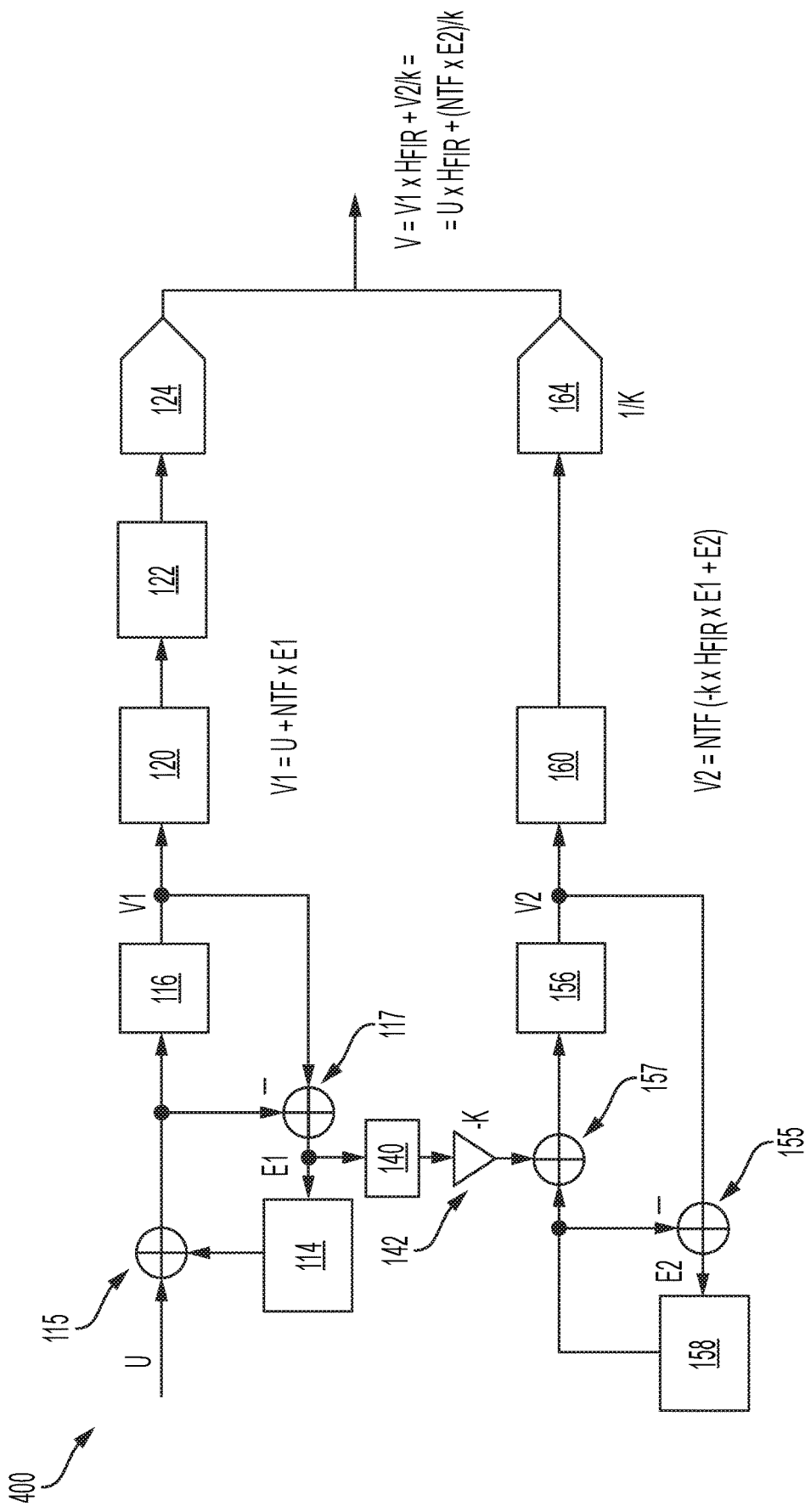
FIG. 4 is a block diagram illustrating a specific implementation of the circuit of FIG. 1, in accordance with some embodiments.

The circuit of FIG. 4 is arranged to suppress (or at least attenuate) the quantization noise of the MSB path, in accordance with some non-limiting embodiments. Signals U and V represent the input and output of the circuit, respectively. Signal V1 represents the output of quantizer 116. Signal E1 represents the quantization noise of quantizer 116. Signal V2 represents the output of quantizer 156. Signal E2 represents the quantization noise of quantizer 156. The gain of gain stage 142 is −K, the gain of DAC 124 is 1 and the gain of DAC 165 is 1/K. The transfer functions of filters 122 and 140 may be set to approximately the same value ($H_{FIR}$ in the example of FIG. 4). The noise transfer function of filters 114 and 158 may be set to approximately the same value (NTF in the example of FIG. 4). It should be appreciated that different implementations may have different values for the responses of the filters, DACs and gain stages.

V1 and V2 may be given by the following expressions:

$$V1 = U + NTF \times E1$$

$$V2 = NTF(-K \times H_{FIR} \times E1 + E2)$$

V1 is passed through filter 122 (having response HFIR) and DAC 124 (having unitary gain). V2 is passed through DAC 165 (having a gain of 1/K). As a result, the output V is given by:

$$\begin{aligned}V &= (V1 \times H_{FIR}) + (V2/K) = \\&= (U \times H_{FIR}) + (NTF \times E1 \times H_{FIR}) = \\&\quad (NTF \times E1 \times H_{FIR}) + (NTF \times E2)/K = \\&= (U \times H_{FIR}) + (NTF \times E2)/K\end{aligned}$$

Thus, the quantization noise of the MSB path, E1, is suppressed, thus improving the signal-to-noise ratio of the output signal.

It should be appreciated that having a gain of −K between the LSB path and the MSB path allows for a reduction in the gain of DAC 164 from 1 to 1/K. This, in turn, results in a reduction of the quantization step size of DAC 164, and as a consequence in a reduction of the space of the overall circuit.

Figure 5:
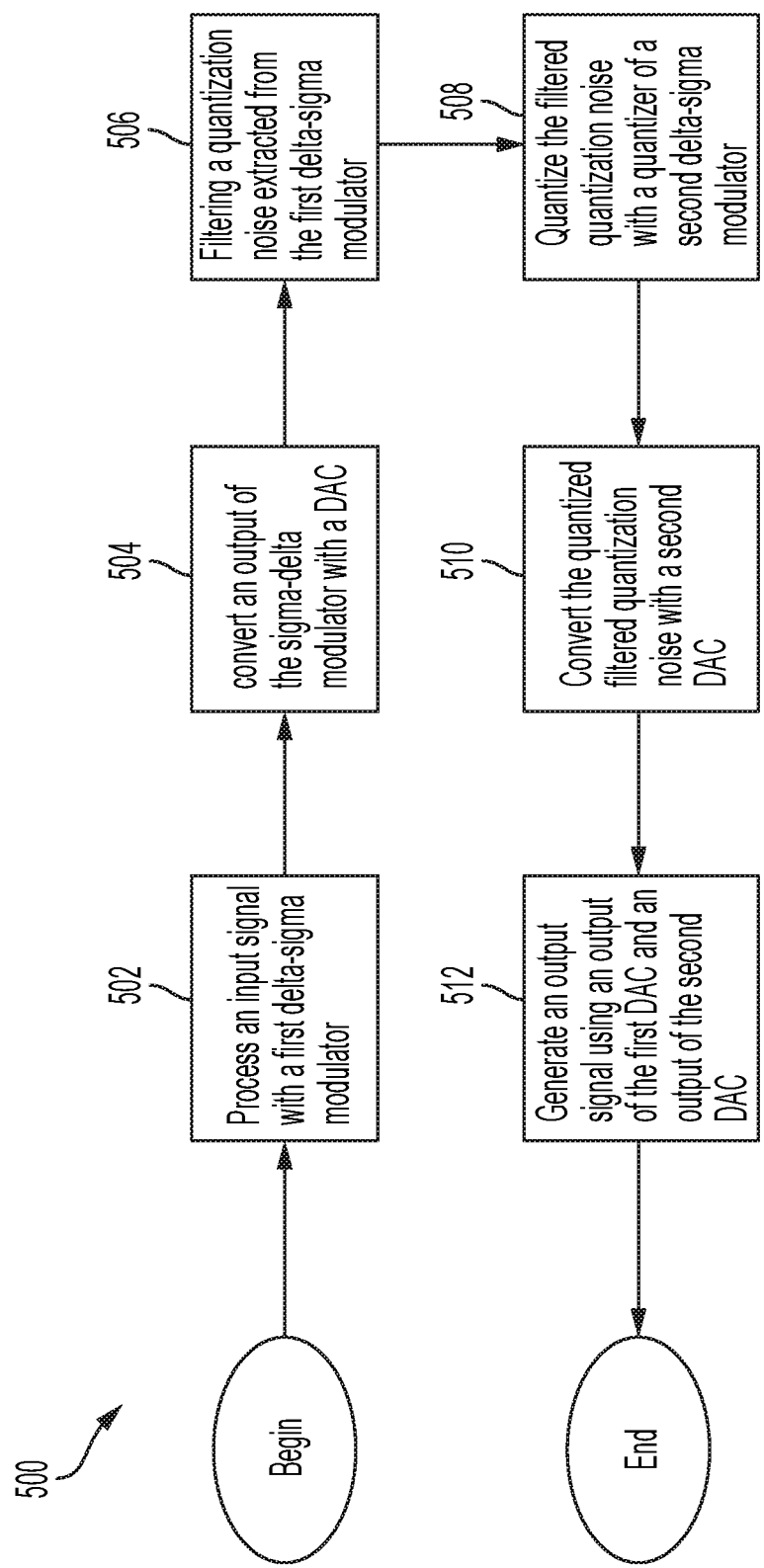
FIG. 5 is a flowchart illustrating a method for converting a digital input into the analog domain, in accordance with some embodiments.

FIG. 5 is a flowchart illustrating a method for converting a digital input into the analog domain, in accordance with some embodiments. In some embodiments, method 500 may be implemented using circuit 100 (e.g., circuit 400).

Method 500 begins at act 502, in which an input signal is processed with a first delta-sigma modulator. Referring for example to FIG. 1, the digital input signal may be processed with delta-sigma modulator 112.

At act 504, the output of the sigma delta modulator is converted with a DAC (e.g., DAC 124 of FIG. 1).

At act 506, the quantization noise extracted from the first delta-sigma modulator (e.g., signal E1 of FIG. 4) is filtered (e.g., using filter 140). Optionally, the quantization noise may be amplified using a gain stage (e.g., gain stage 142).

At act 508, the filtered quantization noise is quantized using the quantizer (e.g., quantizer 156 of FIG. 1) of a second delta-sigma modulator.

At act 510, the quantized filtered quantization noise may be converted with a second DAC (e.g., DAC 164 of FIG. 1).

At act 512, the output of the first DAC may be combined with the output of the second DAC to generate an output analog signal.

II. DAC Controller

Certain audio applications, referred to herein as "high dynamic range audio applications," demand dynamic ranges as high as 130 dB or more. While some listeners may be unable to perceive any meaningful difference between, for example, a 120 db-dynamic range and a 130 dB-dynamic range, other listeners have more acute sense of hearing and are able to appreciate an improvement in the overall quality of the audio when the dynamic range exceeds 130 dB.

The inventors have appreciated that DACs represent the main factor (or at least one of the factors) limiting the dynamic range of certain audio systems. More specifically, one limiting factor is due to the inter-symbol interference (ISI) that inevitably arises in a DAC. ISI is a phenomenon whereby the rising edge and the falling edge of a pulse exhibit different slopes. When ISI occurs, the duration of the falling edge differs from the duration of the rising edge. The result is the introduction of spurious harmonics that can lead to non-linear distortion.

Another limiting factor is due to resistance mismatches which may arise in resistive DACs due to fabrication tolerances. When a resistive DAC that is otherwise designed to have equal resistors has resistors of different resistances, this can lead to an increase in in-band noise, which can also limit the audio system's ability to increase the dynamic range.

The inventors have developed DAC controllers that reduce the negative effects of non-linear distortion caused by ISI and reduce the negative effects of resistance mismatch (at least in those resistive DACs designed to have matching resistors). The DAC controllers developed by the inventors involve toggling (turning on and/or turning off) a fixed number of DAC elements over multiple clock cycles. This technique will be referred to herein as "fixed transition weighting average" or "FTWA." The inventors have appreciated that performing FTWA may partition the error caused by ISI in two components: a systematic component and a random component. The systematic component may include the ISI's DC (directed current) content while the random component may include the ISI's high frequency content. As a result, the systematic component may be in-band (e.g., may have a spectral overlap with the digital signal), while the random component may be out-of-band (e.g., may have no spectral overlap with the digital signal). Being out-of-band, in some embodiments, the random component may be eliminated or at least attenuated through filtering.

Performing FTWA may involve setting a threshold value, where only the DAC elements that are associated to signals that exceed the threshold value are turned on (or turned off). Again, performing FTWA involves turning on (and/or turning off) a fixed number of DAC elements. Thus, in some embodiments, performing FTWA involves maintaining the number of signals exceeding the threshold fixed over time.

Different techniques may be utilized to maintain the number of signals exceeding the threshold fixed over time. In some embodiments, the threshold may be set using a sort algorithm. The sort algorithm may sort the signals based on their magnitude, and may select only the M greatest signals. The DAC components associated with the M greatest signals are then turned on (or turned off), while the state of the other DAC elements remain unchanged. In other embodiments, the threshold may be set using a search algorithm. Unlike the sort algorithm, the search algorithm may not involve ordering the signals based on their magnitudes (or may not involve ordering the signals at all). Rather, the search algorithm may involve varying the threshold until a predefined number of signals (referred to herein as "state signals") exceed the threshold. The inventors have appreciated that, relative to the sort algorithm, the search algorithm may lead to a substantially more efficient DAC design. In one example, a 64-element DAC may be designed with about one hundred five thousands logic gates when implemented based on the sort algorithm and only with twenty-two thousands logic gates when implemented based on the search algorithm. The reduction in logic gates may lead to a reduction in overall power consumption and/or a reduction in the overall circuit footprint.

Figure 6:
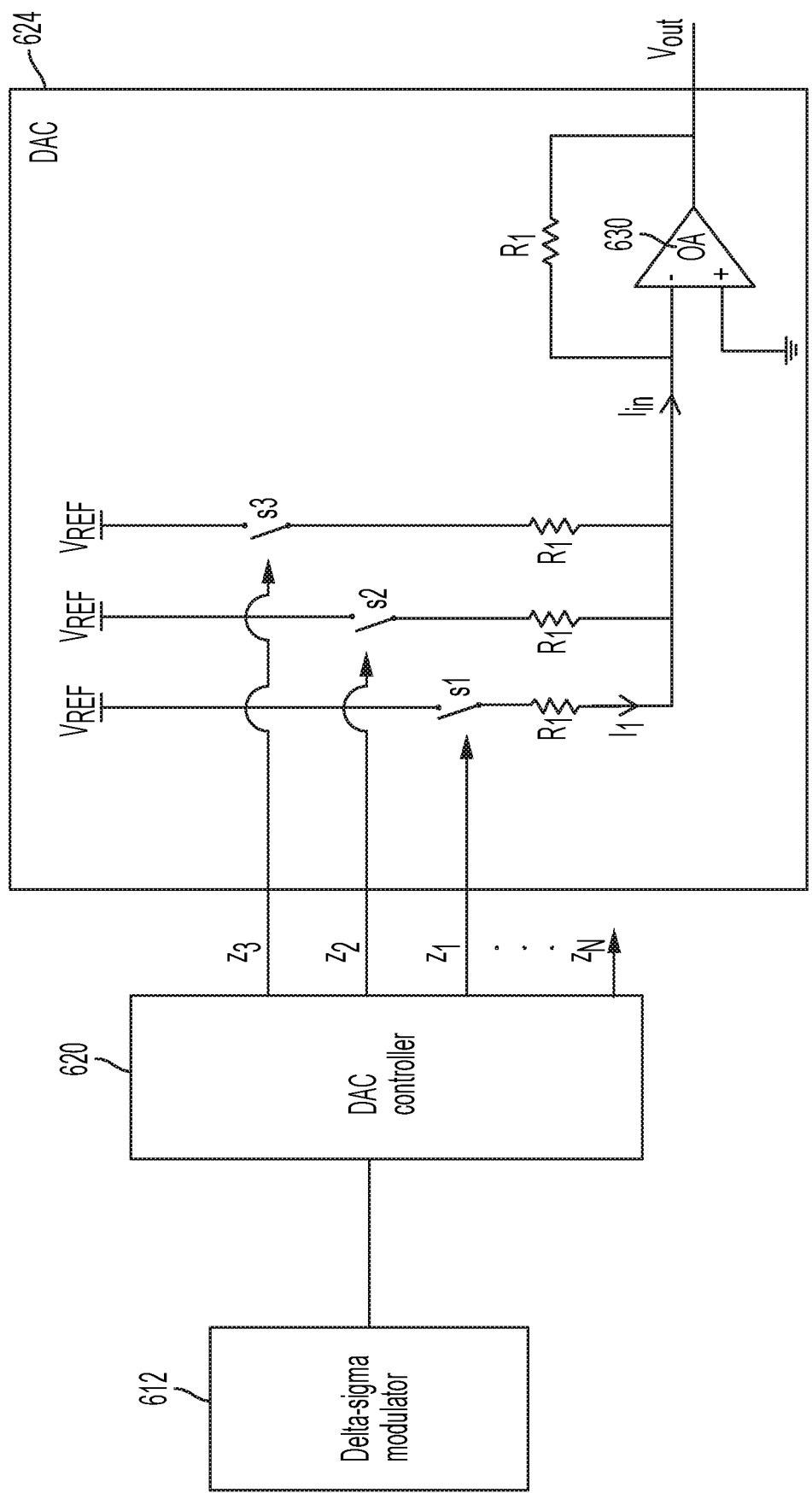
FIG. 6 is a block diagram showing a DAC having multiple switches and circuitry for controlling the switches, in accordance with some embodiments.

FIG. 6 is a block diagram showing delta-sigma modulator 612, a DAC controller 620 and a DAC 624, in accordance with some embodiments. The circuit of FIG. 6 may be used in connection with a segmented digital-to-analog conversion circuit (such as the segmented digital-to-analog conversion circuit of FIG. 1). For example, delta-sigma modulator 612 may serve as delta-sigma modulator 112 of FIG. 1. Additionally, or alternatively, DAC controller 620 may serve as DAC controller 120 of FIG. 1. Additionally, or alternatively, DAC 624 may serve as DAC 124 of FIG. 1. The blocks of FIG. 6 may be used in the MSB path and/or in the LSB path. In other embodiments, however, the circuit of FIG. 6 may be used in connection with non-segmented digital-to-analog conversion circuits. Though not illustrated in FIG. 6, a filter (such as filter 122) may be used with the circuit of FIG. 6, for example between DAC controller 620 and DAC 624.

DAC 624 includes multiple switches and resistors. As such, DAC 624 may be viewed as a resistive DAC. In the illustrated example, the resistors connected in series with the switches s1, s2 and s3 have equal resistance $R_1$, though not all embodiments are limited in this respect as different resistors may have different resistances. When a switch is enabled (is in the on-state), the respective resistor is connected to the reference voltage $V_{REF}$. As a result, a current flows through the resistor, thus contributing to the current ("$I_{in}$") passing through resistors $R_2$ and emerging at the input of the operational amplifier (OA) 630. Vice versa, when a switch is disabled (is in the off-state), no current flows in the respective resistor $R_1$. Thus, such resistor does not contribute to $I_{in}$. The amplitude of the voltage appearing at the output of OA 630 ("$V_{out}$") depends, among other parameters, on which switches are enabled and which switches are disabled.

The state of the switches (enabled or disabled) is determined by the corresponding control bit $z_1, z_2, z_3 \ldots z_N$. For example, when a control bit is set to 1, the corresponding switch may be enabled and when the control bit is set to 0, the corresponding switch may be disabled (though the opposite logic may be used). The control bits are referred to herein collectively as the "control signal," and are generated by DAC controller 620. In some embodiments, DAC controller 620 generates the control bits based on the signal received from delta-sigma modulator 612. Delta-sigma modulator 612 may process input digital signals in any suitable way. For example, delta-sigma modulator 612 may shape the quantization noise to push the noise away from the band of the digital signal.

Figure 7A:
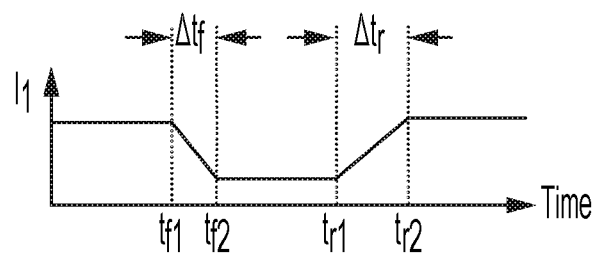
FIG. 7A-7B are plots illustrating the current output from an element of a digital to analog converter in the presence of inter-symbol interference, in accordance with some embodiments.
Figure 7B:
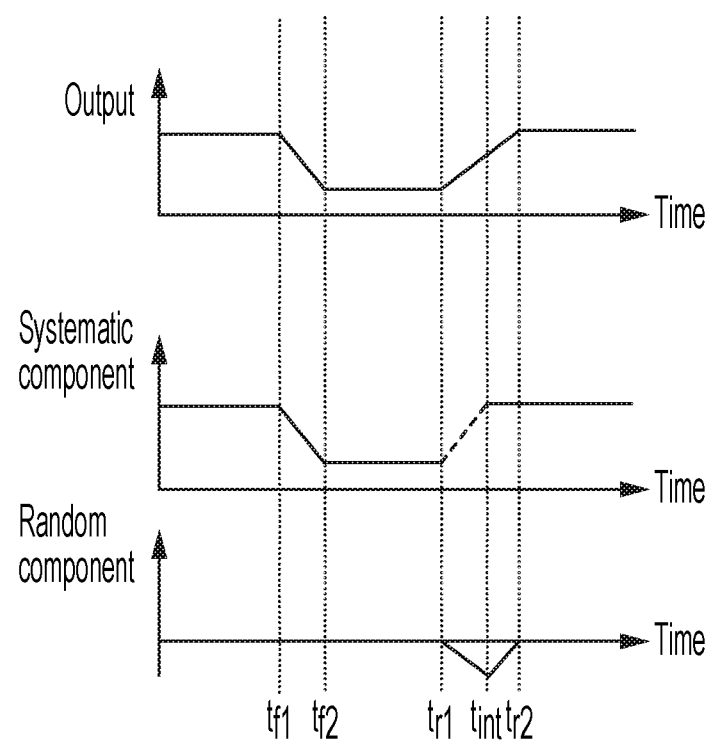

The digital-to-analog conversion circuit of FIG. 6 may suffer from ISI in some embodiments. One such circumstance is depicted in FIG. 7A, illustrating the current $I_1$ (see FIG. 6) vs. time. The plot of FIG. 7A depicts $I_1$ when the control bit (e.g., $z_1$) in FIG. 6 is transitioning from 1 to 0 and then from 0 to 1. As shown, the slope of the 1-to-0 transition is greater than the slope of the 0-to-1 transition. As a result, the duration of the falling edge ($\Delta t_f$, which is equal to $t_{f2}-t_{f1}$) is greater than the duration of the rising edge ($\Delta t_r$, which is equal to $t_{r2}-t_{r1}$). In other embodiments, the duration of the rising edge may be greater than the duration of the falling edge. This imbalance in the duration of the edges may be caused by variety of reasons, including for example due to the unequal drive strength of NMOS and PMOS transistors that are used in some embodiments in the logic circuit that generates z1. The presence of ISI may lead to non-linear distortion. Consider for example the plot of FIG. 7B, in which the signal of FIG. 7A is decomposed into two components: a systematic component and a random component. The systematic component represents the ideal scenario, namely one in which the rising edge and the falling edge have equal durations. The random component represents the difference between the ideal scenario and the actual scenario. Thus, the random component includes a pulse between $t_{r1}$ and $t_{r2}$, with a peak at $t_{int}$.

Figure 8B:
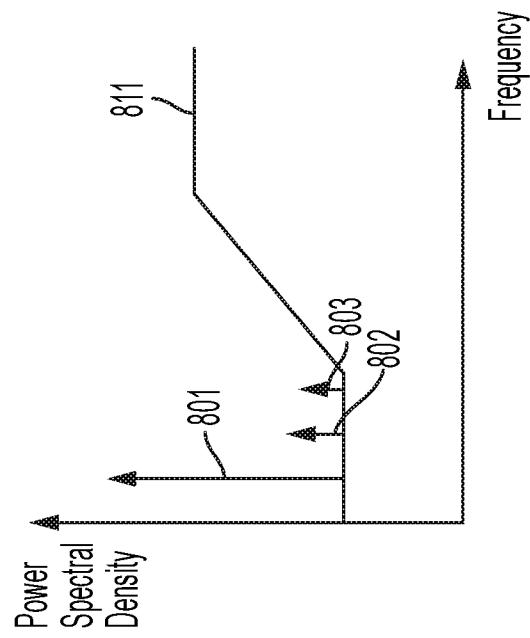
FIG. 8B is a plot illustrating the power spectral density associated with a DAC analog output signal in the presence of mismatch and inter-symbol interference, in accordance with some embodiments.
Figure 8A:
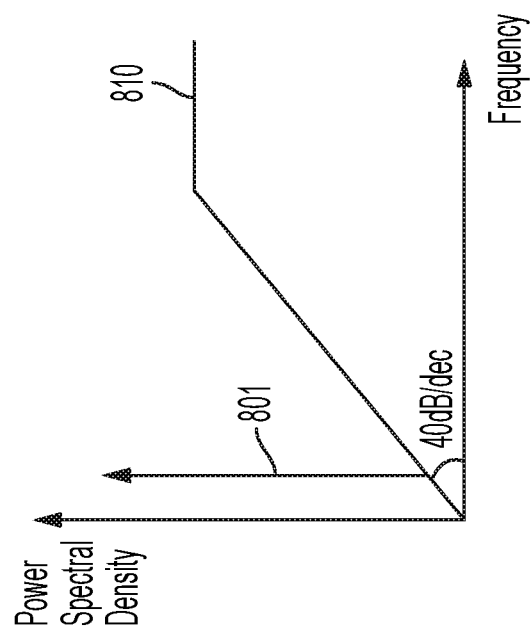
FIG. 8A is a plot illustrating the power spectral density associated with a ADC analog output signal, in accordance with some embodiments.

In some embodiments, the presence of the random component may lead to non-linear distortion. One such scenario is illustrated in FIGS. 8A-8B. FIG. 8A illustrates a scenario in which there is no ISI. In this case, the signal includes a single tone 801 (or a dominant tone, and other negligible tones). On the contrary, FIG. 8B illustrates a scenario in which the presence of ISI gives rise to multiple harmonics of tone 801 (see harmonics 802 and 803). The power of such harmonics may be significant, thus leading to non-linear distortion.

In some embodiments, as described above, DAC 624 may be designed to include resistors of matching resistance $R_1$. In some such embodiments, however, finite fabrication tolerances may lead to resistors having slightly different resistances. Having mismatched resistors may impact the system's ability to reject noise, as further illustrated in FIGS. 8A-8B. In FIG. 8A, the noise spectral response (810) of the digital-to-analog conversion circuit has a slope of 40 dB/decade, which results from the delta-sigma modulator 612 being a second-order sigma-delta modulator, e.g., with a second order filter (though orders other than the second may be used for delta-sigma modulator 612 in other embodiments). In FIG. 8B, however, the slope of the noise spectral response is flat, thus reducing the system's ability to reject noise in the band of the signal. This slope reduction results from the DAC having mismatched resistors.

In some embodiments, the negative effects of ISI and resistance mismatch may be obviated by using an FTWA algorithm, whereby a fixed number of DAC switches are turned on and/or turned off over multiple clock cycles. An example of this technique is illustrated in FIG. 9A.

Figure 9A:
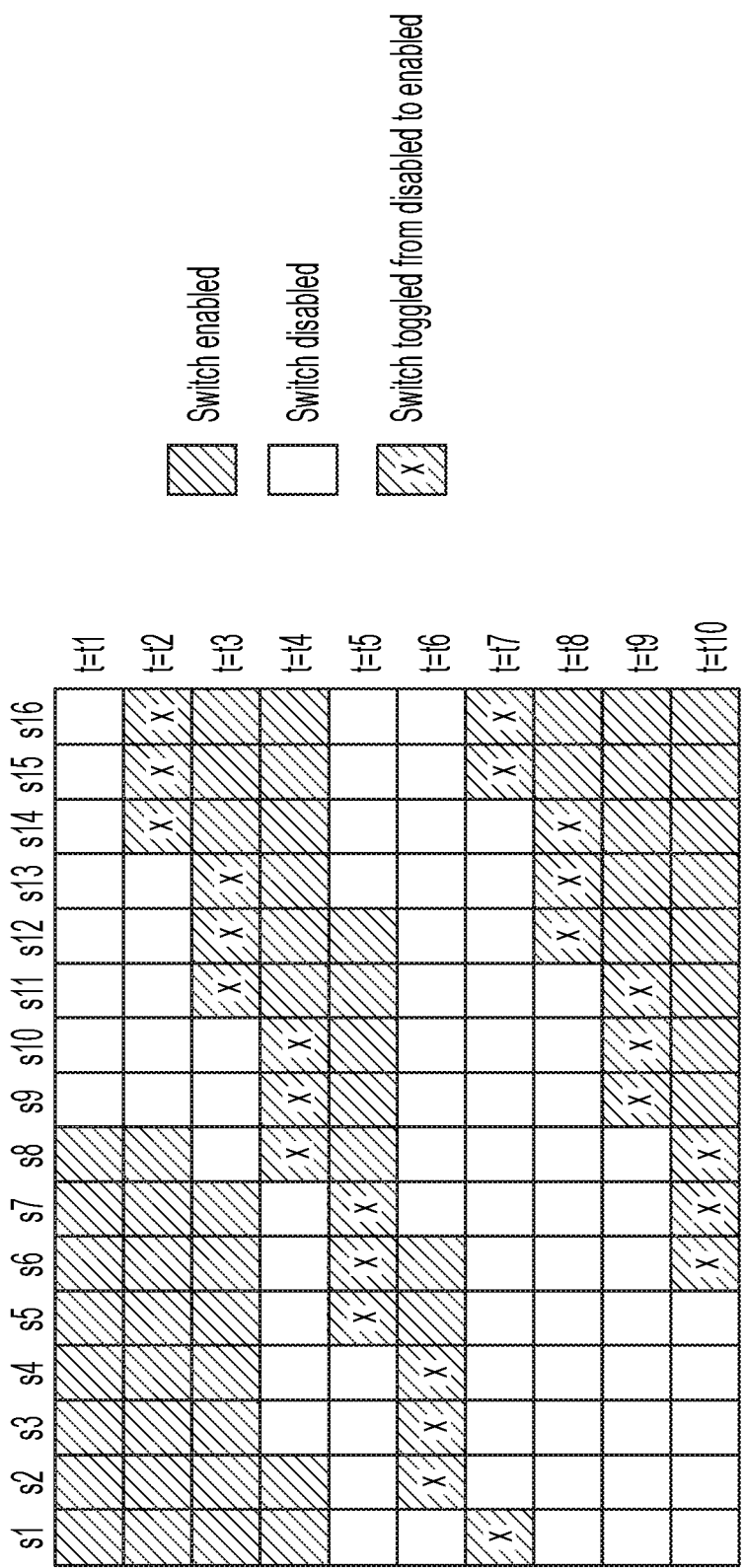
FIG. 9A is a chart illustrating an example of how control bits are toggled over time, in accordance with some embodiments.

FIG. 9A is a chart illustrating the states of switches s1-s10 (assuming that DAC 624 has ten switches in this example). Each column of the chart represents the state of a switch. Each row represents a different clock cycle. For example, "t=t1" indicates the first clock cycle, "t=t2" indicates the second clock cycle, etc. Thus, by way of example, the box positioned at the intersection of column "s4" with row "t=t6" indicates the state of the fourth switch at the sixth clock cycle.

Dark-colored boxes indicate that the corresponding switches are enabled at the corresponding clock cycles. White boxes indicate that the corresponding switches are disabled at the corresponding clock cycles. Boxes marked with an "x" indicate that the state of the corresponding switch has been toggled, at the corresponding clock cycle, from the disabled state to the enabled state.

In the example of FIG. 9A, the FTWA algorithm involves toggling a fixed number of switches (3 in this example) from the disabled state to the enabled state (though, additionally or alternatively, the FTWA algorithm may involve toggling a fixed number of switches from the enabled state to the disabled state). For example, at t=t2, only switches s14, s15 and s16 are toggled from the disabled state to the enabled state; at t=t3, only switches s11, s12, and s13 are toggled from the disabled state to the enabled state; at t=t4, only switches s8, s9, and s10 are toggled from the disabled state to the enabled state; etc.

In some embodiments, a control signal may be used to set the state of the switches. For example, in the system of FIG. 6, a control signal including control bits $z_1, z_2, z_3 \ldots z_N$ may be used to set the state of switches $s_1, s_2, s_3 \ldots s_N$. When a control bit is 1, the corresponding switch is enabled and when the control bit is 0, the corresponding switch is disabled (though the opposite logic may be used). In some embodiments, toggling a fixed number of switches may involve toggling a fixed number of control bits. For example, toggling a fixed number of switches from the disabled state to the enabled state may involve toggling a fixed number of control bits from 0 to 1.

In some embodiments, toggling a fixed number of switches from one state to another as shown in the example of FIG. 9A may reduce the negative effects of ISI and resistance mismatch. For example, in some embodiments, toggling a fixed number of switches from one state to another may partition the error caused by ISI in a systematic component and a random component. The systematic component may include the ISI's DC content. The random component may include the ISI's high frequency content. As a result, the systematic component may appear in-band while the random component may appear out-of-band. Being out-of-band, the random component may be eliminated or at least attenuated through the filter defined by delta-sigma modulator 612.

Figure 9B:
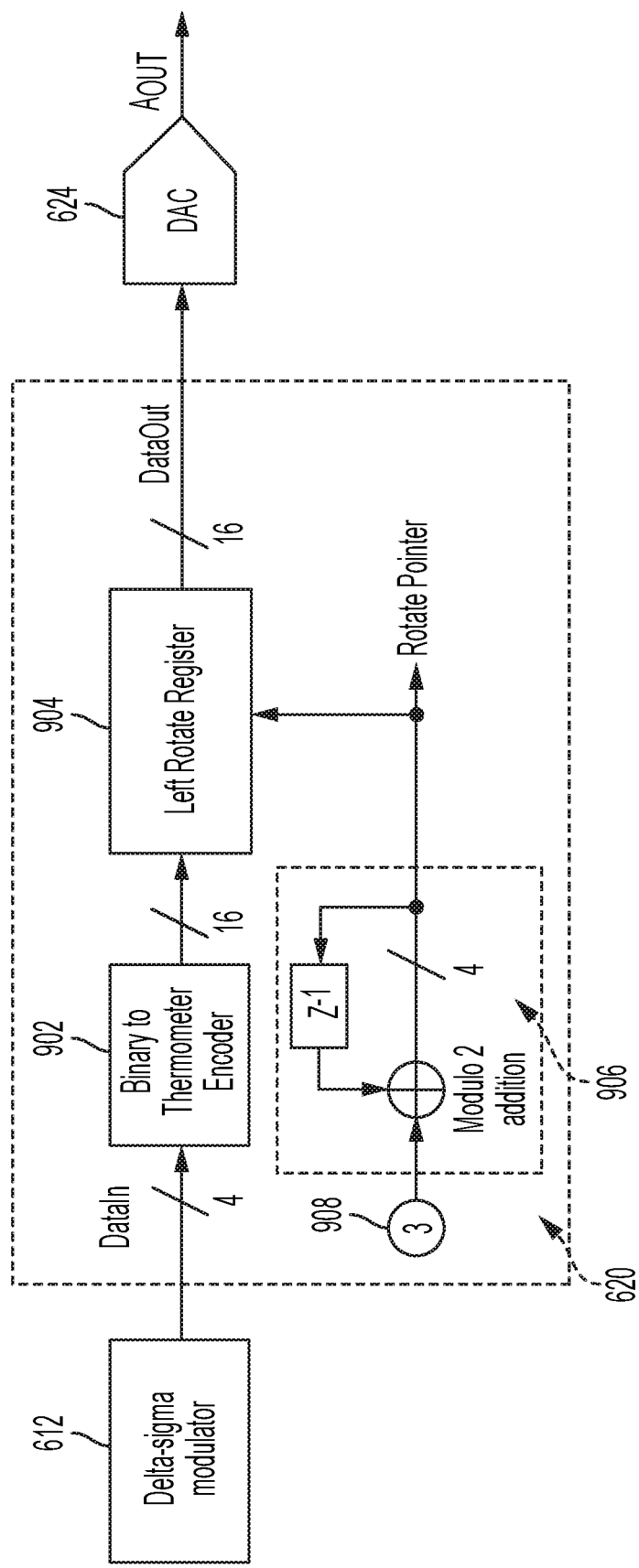
FIG. 9B is a block diagram illustrating an example of a DAC controller, in accordance with some embodiments.

One example of a DAC controller 620 for performing FTWA is illustrated in FIG. 9B, in accordance with some non-limiting embodiments. In this example, DAC controller 620 operates at 16 bits (e.g., so that it may control a DAC having 16 switches). Specifically, each sub-system outputs a control bit ($z_1 \ldots z_{16}$), which controls the state of a respective switch.

The FTWA DAC controller 620 in FIG. 9B comprises a binary to thermometer encoder 902, a left rotate register 904, and modulo 2 accumulator 906. The modulo 2 accumulator 906 accumulates the constant value in 908 which is 3 to generate the rotate pointer. The rotate pointer is used as an input the left rotate register 904 to rotate the 16 bit register input and thus generating the output DataOut which the input to the DAC 624.

Figure 10A:
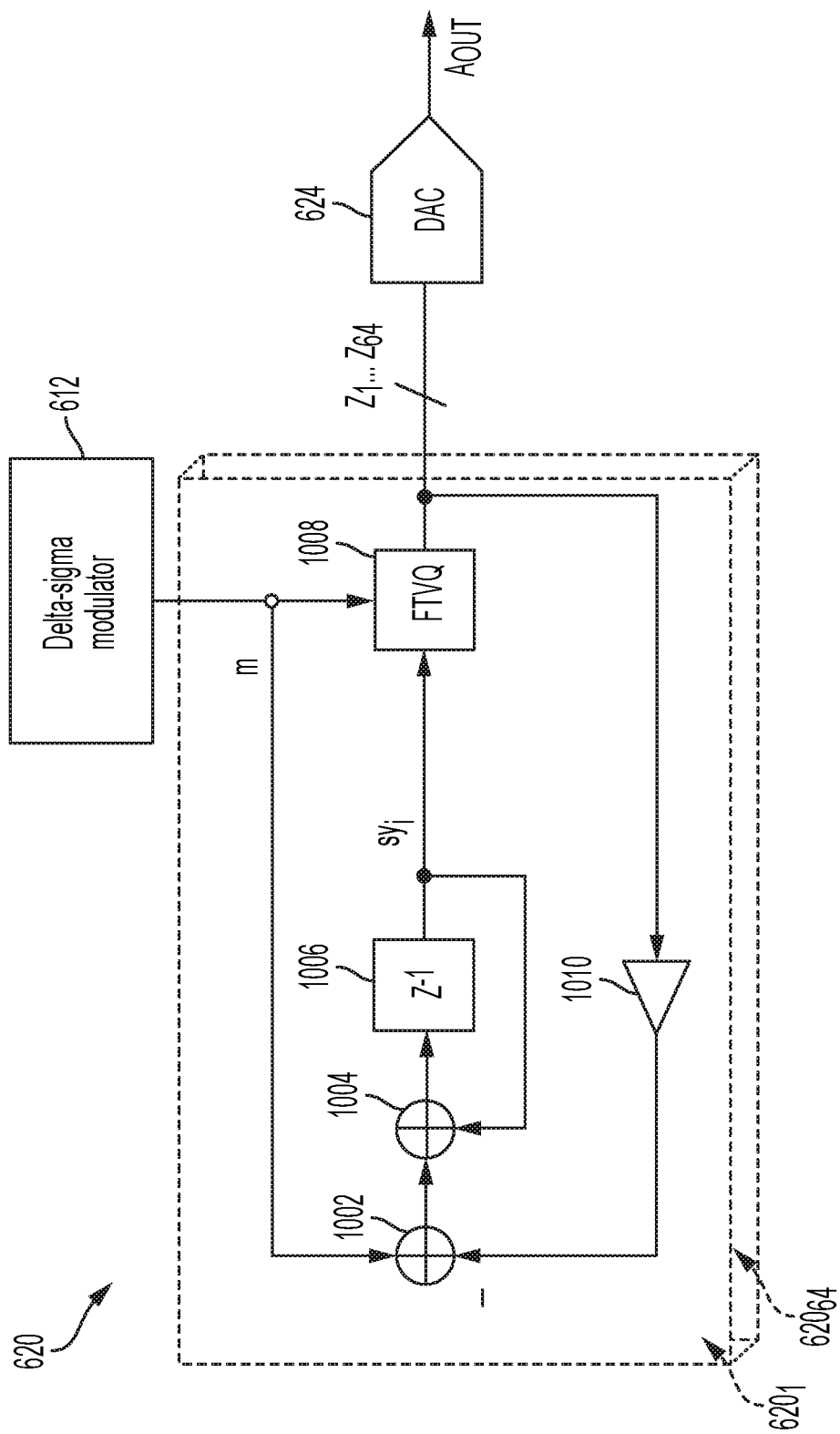
FIG. 10A is a block diagram illustrating another example of a DAC controller, in accordance with some embodiments.

Another example of a DAC controller 620 for performing fixed transition vector element selection logic FTVESL is illustrated in FIG. 10A, in accordance with some non-limiting embodiments. In this example, DAC controller 620 operates at 64 bits (e.g., so that it may control a DAC having 64 switches). Thus, in this example, DAC controller 620 includes 64 sub-systems $620_1 \ldots 620_{64}$, each being configured to control a respective switch of DAC 624. Specifically, each sub-system outputs a control bit ($z_1 \ldots z_{64}$), which controls the state of a respective switch.

For purposes of clarity, only the circuit of sub-system $620_1$ is illustrated. The other sub-systems may have similar implementations. Sub-system $620_1$ includes adders 1002 and 1004, delay unit 1006, fixed transition vector quantizer (FTVQ) 1008 and amplifier 1010. In some embodiments, the same signal ($m_i$) provided as input to FTVQ 1008 is also provided as input to adder 1002, so that the output of delay unit 1006 remains bounded and does not diverge and hence the feedback loop is stable. Signal m may represent the output of delta-sigma modulator 612.

Adder 1002 subtracts the output of amplifier 1010 from signal m. The output of adder 1002 is provided as input to adder 1004. Adder 1004 adds the output of adder 1002 to the output of delay unit 1006. The output of adder 1004 is provided as input to delay unit 1006. The output of delay unit 1006 is provided as input to FTVQ 1008. The output of FTVQ 1008 controls the status of a switch of DAC 624, and is also provided as input to amplifier 1010.

Figure 10B:
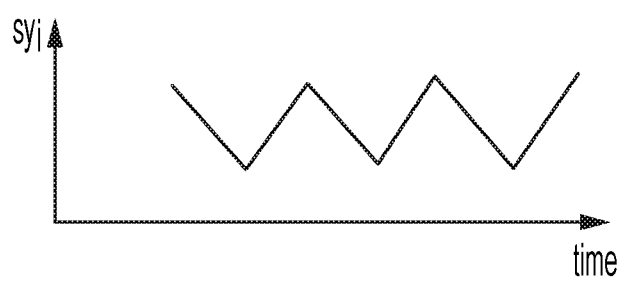
FIG. 10B is a plot illustrating an example of a signal $sy_i$ of FIG. 10A, in accordance with some embodiments.
Figure 10C:
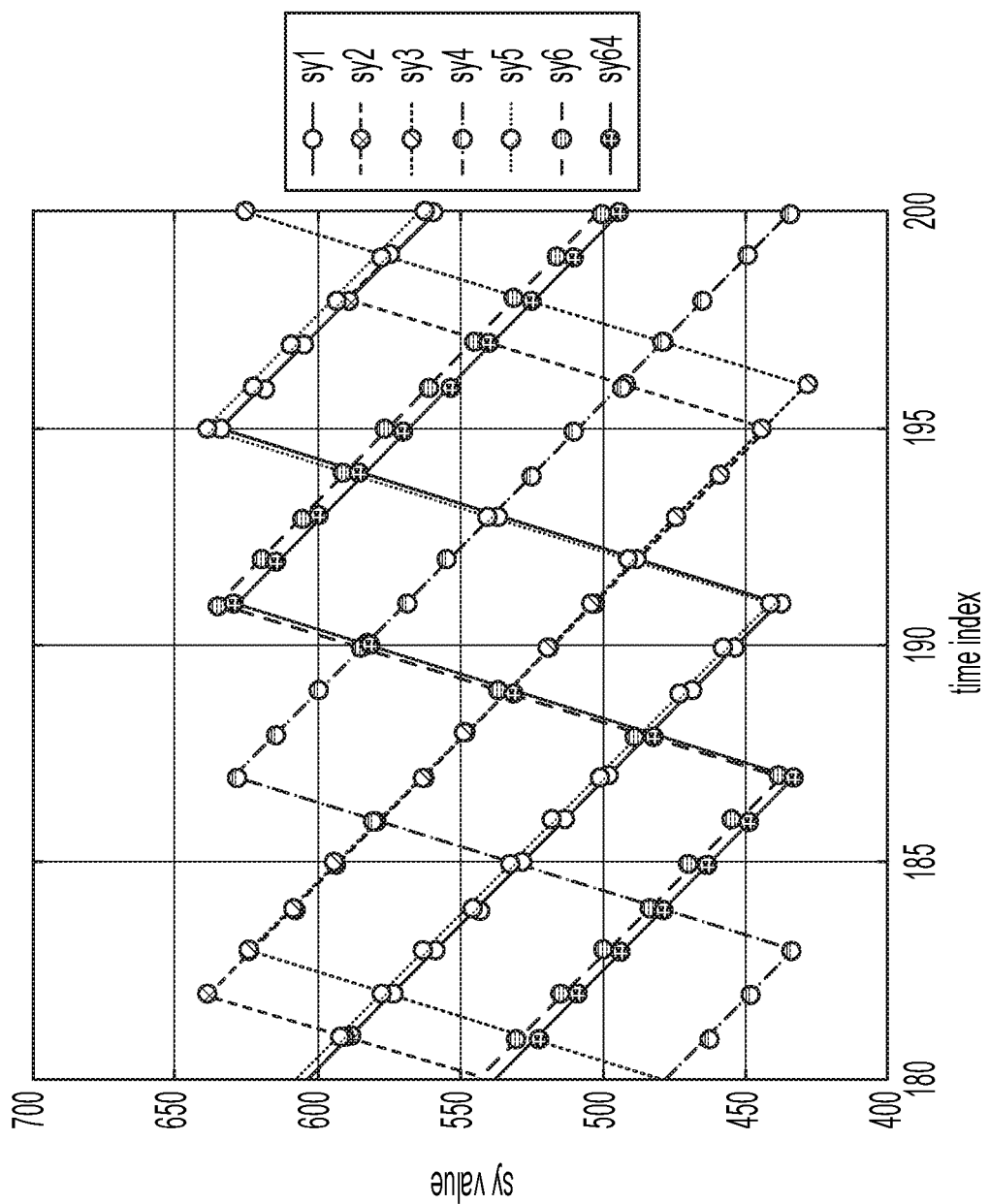
FIG. 10C is a plot illustrating how the signals $sy_i$ may vary over time, in accordance with some embodiments.

Signal $sy_i$—the output of delay unit 1006—is also referred to herein as a "state signal." The subscript "i" indicates that there is a state signal for each of the subsystems $620_1 \ldots 620_{64}$. In some embodiments, state signals $sy_i$ may vary over time according to triangular waves, as shown in FIG. 10B. FIG. 10C illustrates a representative subset of the state signal ($sy_1$, $sy_2$, $sy_3$, $sy_4$, $sy_5$, $sy_6$ and $sy_{64}$ in this case) which vary according to triangular waves. The x-axis represents the time variable expressed as a discrete time index. The y-axis represents the value of the state signals.

In some embodiments, toggling a fixed number of DAC switches may involve monitoring the state signals of DAC controller 620. In some embodiments, the DAC controller 620 may select the switches to be toggled based on the state signals. This may be done in accordance with a sorting algorithm or in accordance with a search algorithm, among other possible techniques.

Figure 11A:
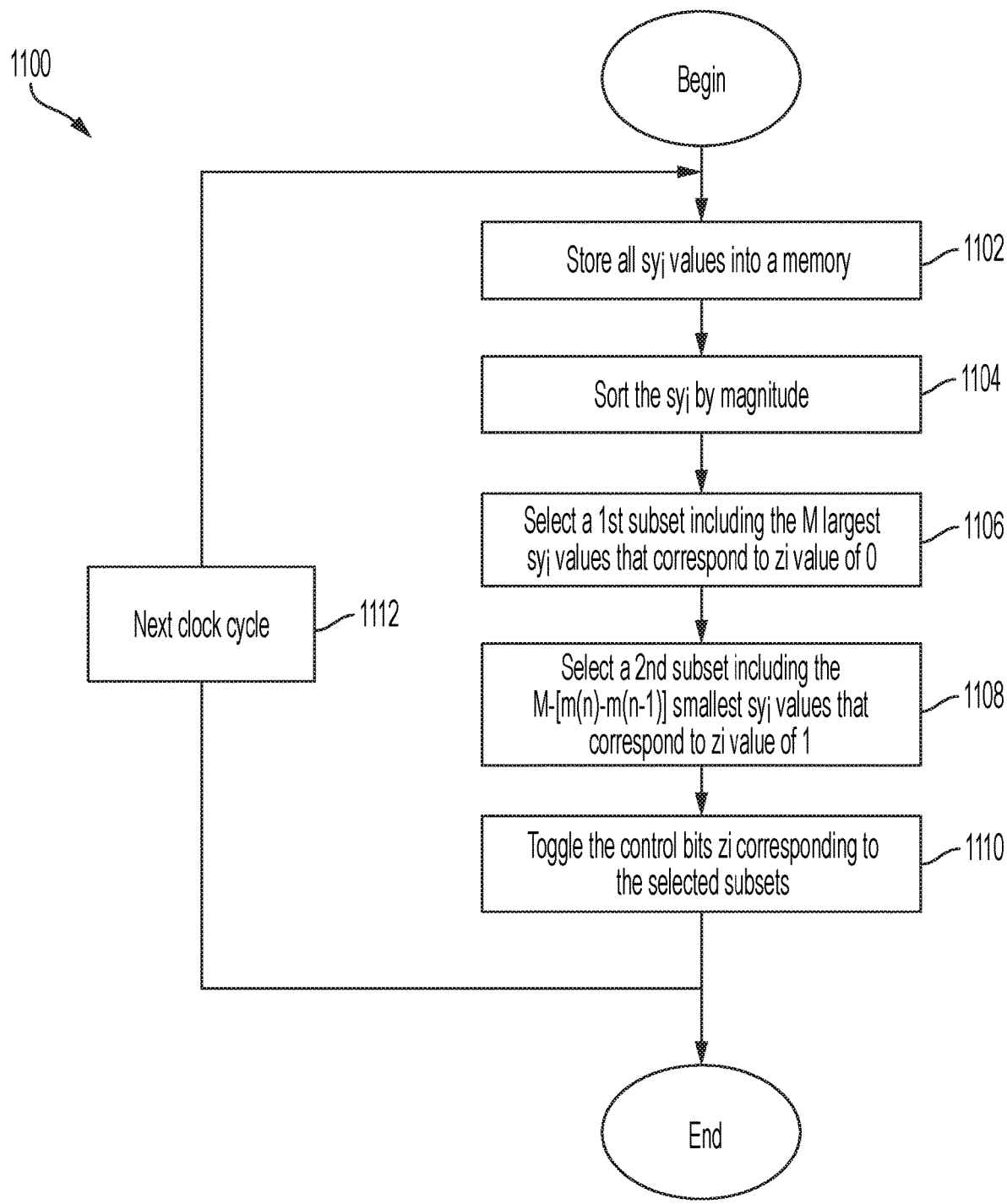
FIG. 11A is a flowchart illustrating a sort algorithm, in accordance with some embodiments.

An example of a sort algorithm is depicted in FIG. 11A, in accordance with some non-limiting embodiments. At act 1102, the DAC controller 620 stores all the $sy_i$ values into a memory. At act 1104, the DAC controller 620 sorts the $sy_i$ values by magnitude (e.g., from the smallest to the largest or vice versa). At act 1106, the DAC controller 620 selects a first subset of the M largest $sy_i$ values that correspond to $z_i$ values equal to zero. At act 1108, the DAC controller 620 selects a second subset of M-[m(n)-m(n-1)] smallest $sy_i$ values that correspond to $z_i$ values equal to one. At act 1110, the DAC controller 620 toggles the M control bits corresponding to (having the same i index as) the first and second subsets. At act 1112, the clock count is increased and acts 1102-1110 are repeated. Thus, at each clock cycle, a fixed number of control bits (and correspondingly, a fixed number of DAC switches), is toggled from one value to another.

Figure 11B:
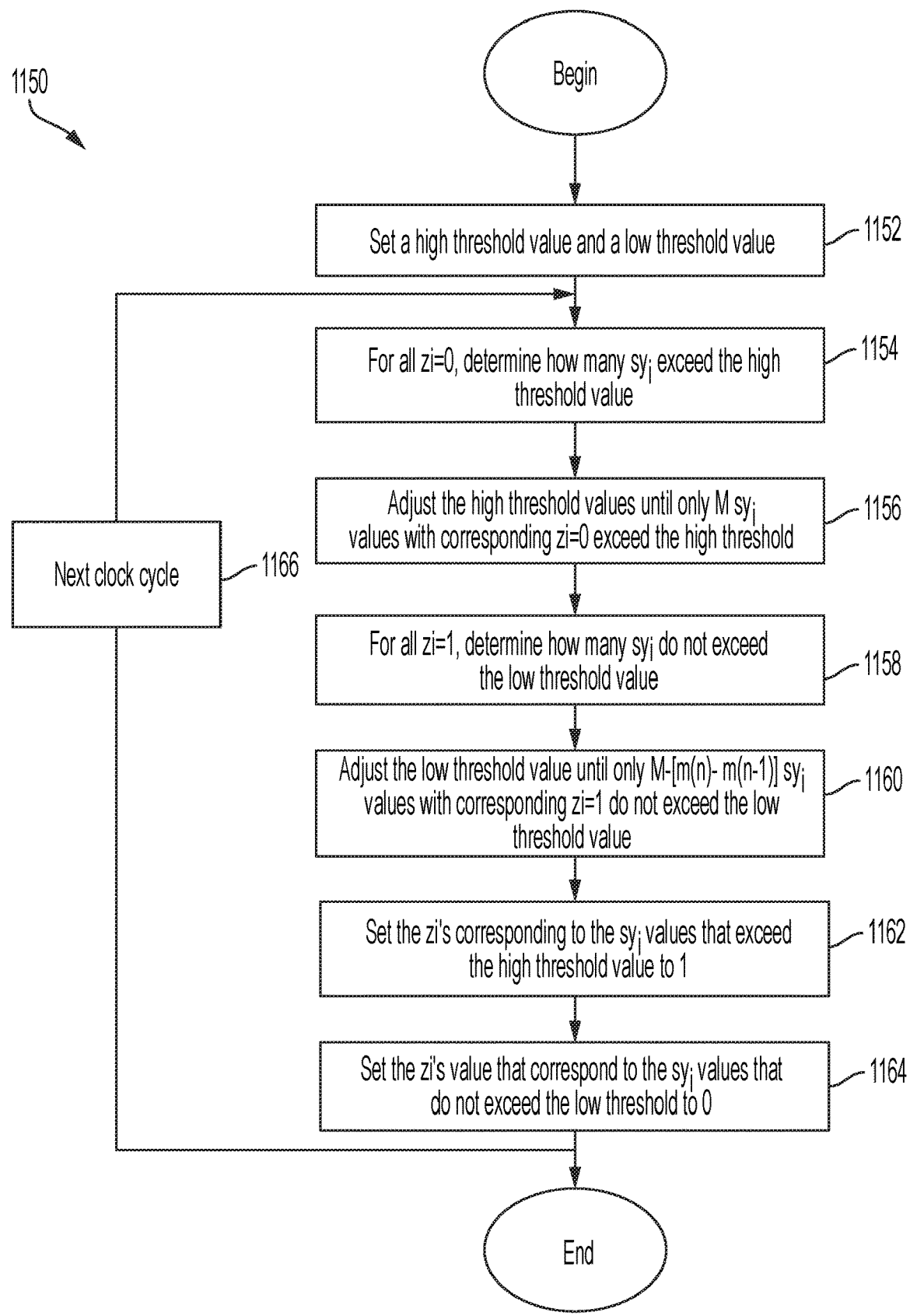
FIG. 11B is a flowchart illustrating a search algorithm, in accordance with some embodiments.
Figure 12A:
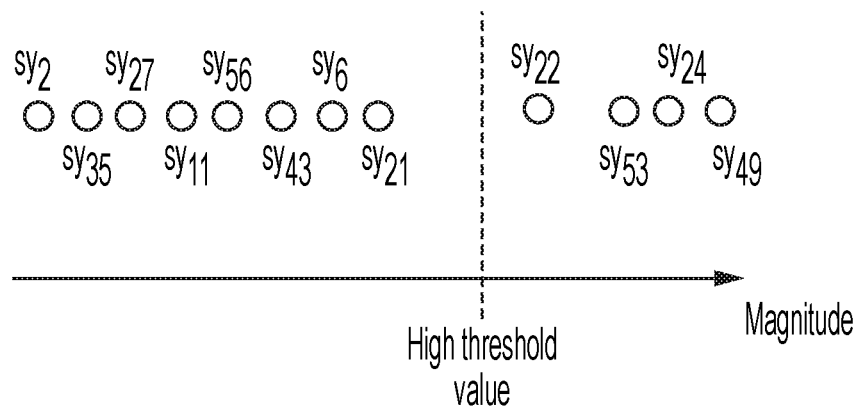
FIG. 12A-12B illustrating visually an example of a search algorithm, in accordance with some embodiments.
Figure 12B:
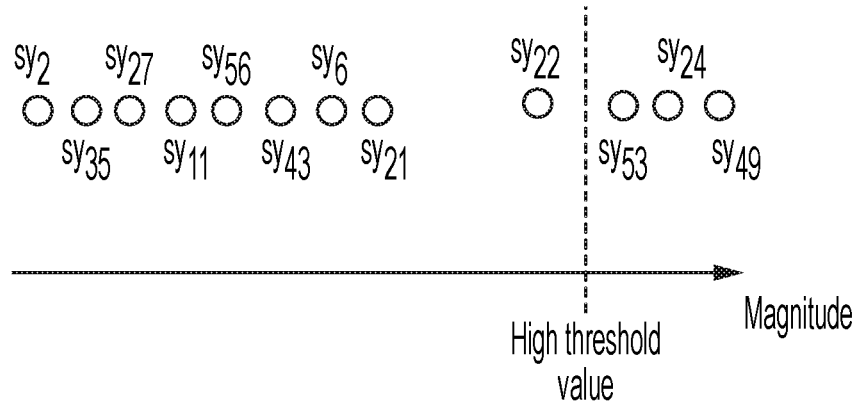

An example of a search algorithm is depicted in FIG. 11B, in accordance with some non-limiting embodiments. FIGS. 12A and 12B are plots that visually illustrate an example of a search algorithm. At act 1152, the DAC controller 620 sets a high threshold value and a low threshold value. For example, with reference to FIG. 12A, the high threshold value may be set to a certain initial value. At act 1154, DAC controller 620 determines how many $sy_i$ values exceed the high threshold value while at the same time corresponding to $z_i$ values equal to zero. In the example of FIG. 12A, the DAC controller 620 determines that four $sy_i$ values exceed the threshold, namely $sy_{22}$, $sy_{53}$, $sy_{24}$ and $sy_{49}$ and where $z_{22}=z_{53}=z_{24}=z_{49}=0$. At act 1156, DAC controller 620 adjusts (e.g., increases or decreases) the threshold value until only M $sy_i$ values exceed the threshold value (it will be assumed that M=3 in this example, though M may be set to any other suitable value). In the example of FIG. 12B, the threshold value is increased until only 3 $sy_i$ values exceed the threshold value, in this case $sy_{53}$, $sy_{24}$ and $sy_{49}$. At act 1158, the DAC controller 620 determines how many syi do not exceed the low threshold value while at the same time correspond to zi that have a value of one. At act 1160, the DAC controller 620 adjust the low threshold value until only M-[m(n)-m(m-1)] syi's do not exceed the threshold and at the same time have corresponding zi=1. At act 1162, the DAC controller 620 toggles the M control bits from a first value (e.g., 0) to a second value (e.g., 1) corresponding to the $sy_i$ values that exceed the high threshold value. In this example, the DAC controller 620 toggles control bits $z_{53}$, $z_{24}$ and $z_{49}$. This results in the states of switches $s_{53}$, $s_{24}$ and $s_{49}$ being toggled (e.g., from disabled to enabled). At act 1164, the DAC controller 620 toggles the M-[m(n)-m(n-1)] control bits from a second value (e.g., 1) to a first value (e.g., 0) corresponding to the $sy_i$ values that do not exceed the low threshold value. In some embodiments, the search of FIG. 11B may be performed using a binary search (e.g., a search in which the value of the threshold value is moved to the middle value of the range exceeding the threshold). The convergence of the search may be accelerated by utilizing the statistical correlation between threshold values from sample to sample to reduce the search range. Moreover, the convergence may be accelerated by using predictive algorithms to estimate the new value of the threshold, for example using zero-order or first-order extrapolation from previous pointer values.

In the example of FIGS. 12A-12B, only the bits corresponding to state signals that exceed the threshold value are toggled from a first value to a second value. In other embodiments, however, only the bits corresponding to state signals that are below the threshold value may be toggled from the first value to the second value.

Figure 13:
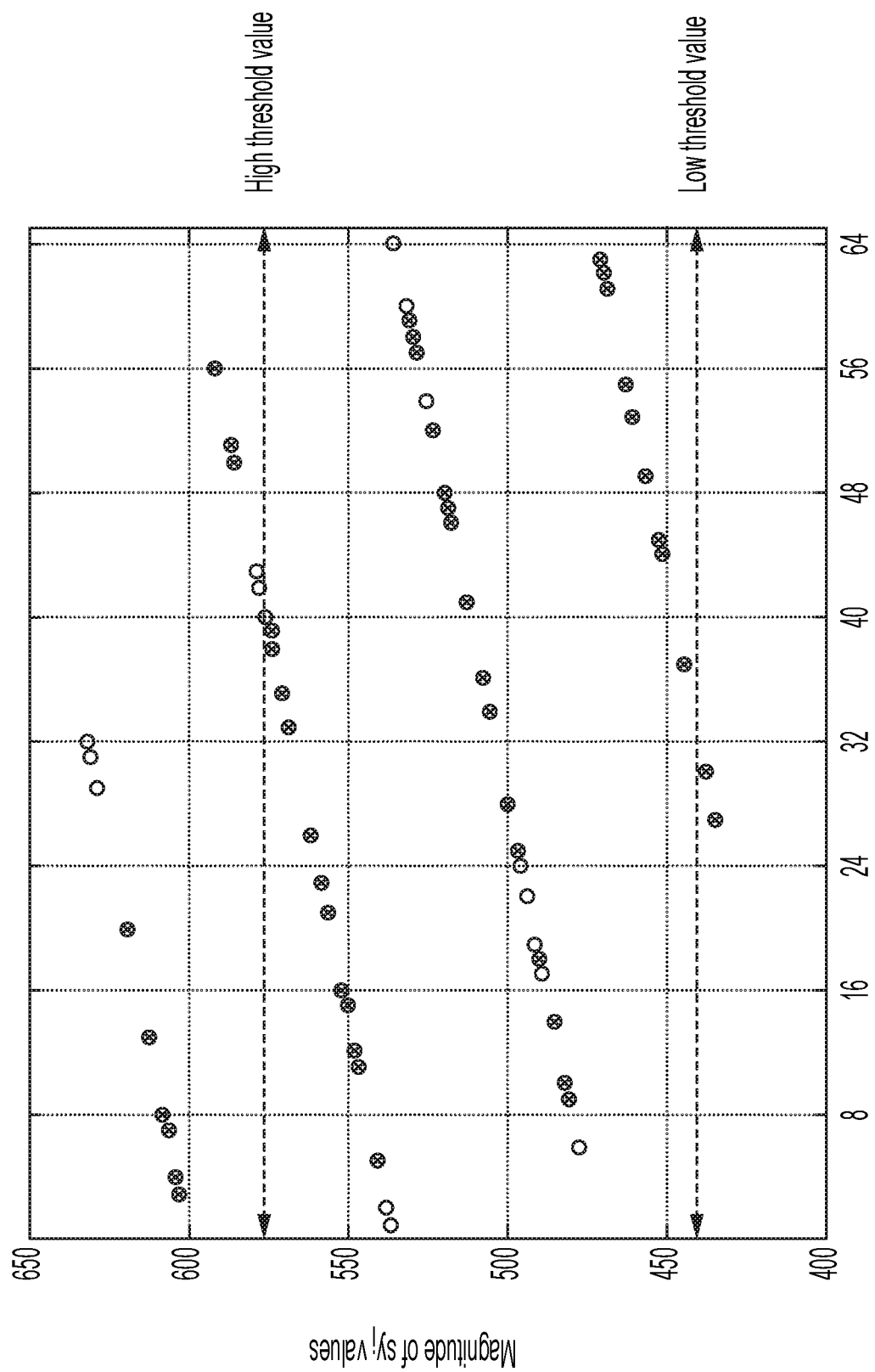
FIG. 13 is a plot illustrating an algorithm for selecting a subset of bits, in accordance with some embodiments.

In the example of FIG. 13, a pair of threshold values (a high threshold value and a low threshold value) are used in connection with the search algorithm. FIG. 13 is a plot in which the x-axis represents element index i and the y-axis represents the magnitude of the corresponding $sy_i$ value. In this case, the high threshold value is adjusted until only a number equal to $M_1$ of $sy_i$ values, with corresponding zi=0,exceed the high threshold value, and the low threshold value is adjusted until only a number equal to $M_2$ of $sy_i$ values, with corresponding zi=1, are below the low threshold value. The $M_1$ control bits corresponding to the $sy_i$ values exceeding the high threshold value may be toggled from a first value (e.g., 0) to a second value (e.g., 1). The $M_2$ control bits corresponding to the $sy_i$ values that are below the low threshold value may be toggled from the second value to the first value. Accordingly, the $M_1$ switches corresponding to the $M_1$ control bits are toggled from a first state (e.g., disabled) to a second state (e.g., enabled), and the $M_2$ switches corresponding to the $M_2$ control bits are toggled from the second state to the first state.

The search algorithm may have several advantages over the sort algorithm. First, it may increase the speed at which the digital-to-analog conversion converges. Second, it may reduce the complexity (e.g., number of transistors) of the DAC controller.

III. Conclusion

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A circuit comprising:
a most significant bit (MSB) path comprising:
a first delta-sigma modulator having first and second outputs; and
a first digital-to-analog converter coupled to the first output of the first delta-sigma modulator;
a digital filter coupled to the second output of the first delta-sigma modulator; and
a least significant bit (LSB) path comprising:
a second delta-sigma modulator comprising a loop filter and a quantizer, the quantizer having an input coupled to the loop filter and to the digital filter; and
a second digital-to-analog converter coupled to an output of the quantizer.

2. The circuit of claim 1, wherein the first delta-sigma modulator comprises a first quantizer,
wherein the first output of the first delta-sigma modulator is an output of the first quantizer, and
wherein the quantizer is a second quantizer.

3. The circuit of claim 2, wherein the second output of the first delta-sigma modulator is derived from the output of the first quantizer.

4. The circuit of claim 2, wherein the first delta-sigma modulator further comprises a first loop filter, a first adder and a second adder,
wherein the first adder is coupled to an input of the first quantizer, the second adder is coupled to the output of the first quantizer and the first loop filter is coupled between the first adder and the second adder, and
wherein the loop filter is a second loop filter.

5. The circuit of claim 4, wherein the second output of the first delta-sigma modulator is an output of the second adder.

6. The circuit of claim 1, wherein the second digital-to-analog converter has less inputs than the first digital-to-analog converter.

7. The circuit of claim 1, further comprising an amplifier coupled to the digital filter.

8. A circuit comprising:
a most significant bit (MSB) path comprising:
a first delta-sigma modulator having first and second outputs; and
a first digital-to-analog converter coupled to the first output of the first delta-sigma modulator;
an amplifier coupled to the second output of the first delta-sigma modulator; and
a least significant bit (LSB) path comprising:
a second delta-sigma modulator comprising a loop filter and a quantizer, the quantizer having an input coupled to the loop filter and to the amplifier; and
a second digital-to-analog converter coupled to an output of the quantizer.

9. The circuit of claim 8, wherein the first delta-sigma modulator comprises a first quantizer,
wherein the first output of the first delta-sigma modulator is an output of the first quantizer, and
wherein the quantizer is a second quantizer.

10. The circuit of claim 9, wherein the first delta-sigma modulator further comprises a first loop filter, a first adder and a second adder,
wherein the first adder is coupled to an input of the first quantizer, the second adder is coupled to the output of the first quantizer and the first loop filter is coupled between the first adder and the second adder, and
wherein the loop filter is a second loop filter.

11. The circuit of claim 10, wherein the second output of the first delta-sigma modulator is an output of the second adder.

12. The circuit of claim 8, wherein the second digital-to-analog converter has less inputs than the first digital-to-analog converter.

13. The circuit of claim 8, wherein the second delta-sigma modulator further comprises a first adder and a second adder,
wherein the first adder is coupled to the input of the quantizer, the second adder is coupled to the output of the quantizer and the loop filter is coupled between the first adder and the second adder.

14. A method for controlling a digital-to-analog converter (DAC) having a plurality of switches, the method comprising:
processing an input digital signal with a delta-sigma modulator; and
generating, based on the processed input digital signal, a control signal comprising N control bits, each one of the N control bits being configured to control a respective switch of the plurality of switches of the DAC, wherein:
the generating comprises toggling, in each of a plurality of clock cycles, a same number of control bits of the N control bits from a first value to a second value, the number being less than N, and
the toggling comprises setting a threshold value.

15. The method of claim 14, further comprising generating a plurality of state signals based on the processed input digital signal and generating the N control bits based on the plurality of state signals, wherein toggling the same number of control bits comprises toggling a subset of the N control bits corresponding to respective state signals that exceed the threshold value or are below the threshold value.

16. The method of claim 15, wherein setting the threshold value comprises performing a search algorithm.

17. The method of claim 16, wherein performing the search algorithm comprises varying the threshold value until a predefined number of the plurality of state signals exceeds or is below the threshold value.

18. The method of claim 15, wherein the plurality of state signals exhibit triangular waves.

19. The method of claim 14, wherein generating, based on the processed input digital signal, the control signal comprises providing the processed input digital signal to a quantizer and to an adder.

20. The method of claim 14, wherein processing the input digital signal with the delta-sigma modulator comprises processing the input digital signal with a second order delta-sigma modulator.

* * * * *